(12) United States Patent
Kataoka

(10) Patent No.: US 7,806,987 B2
(45) Date of Patent: Oct. 5, 2010

(54) WASHING DEVICE AND ITS WORK CONVEYING METHOD

(75) Inventor: Keiji Kataoka, Okazaki (JP)

(73) Assignee: Fine Machine Kataoka Co., Ltd, Aichi-ken (JP)

( * ) Notice: Subject to any disclaimer, the term of this patent is extended or adjusted under 35 U.S.C. 154(b) by 422 days.

(21) Appl. No.: 11/905,651

(22) Filed: Oct. 3, 2007

(65) Prior Publication Data

US 2008/0196741 A1 Aug. 21, 2008

Related U.S. Application Data

(62) Division of application No. 10/304,003, filed on Nov. 26, 2002, now Pat. No. 7,290,551.

(30) Foreign Application Priority Data

Nov. 29, 2001 (JP) .............................. 2001-364391

(51) Int. Cl.
*B08B 7/04* (2006.01)
*B08B 7/00* (2006.01)
*B08B 3/00* (2006.01)

(52) U.S. Cl. .............................. 134/26; 134/32; 134/34; 134/9; 134/15; 134/200; 134/76; 134/82; 134/133

(58) Field of Classification Search .................... 134/32, 134/26, 34, 200, 9, 15, 33, 76, 82, 133, 85, 134/134, 137, 153, 157, 64 R; 414/222.01, 414/222.12, 222.03, 222.07, 222.08, 226.05, 414/800, 806, 815

See application file for complete search history.

(56) References Cited

U.S. PATENT DOCUMENTS 3,166,082 A 1/1965 Arnold et al.
3,276,984 A 10/1966 Barringer et al.

(Continued)

FOREIGN PATENT DOCUMENTS

| JP | 1-192122 | 8/1989 |
|---|---|---|
| JP | 7-136606 | 5/1995 |
| JP | 9-181039 | 7/1997 |
| JP | 2001-340-819 | 12/2001 |

OTHER PUBLICATIONS

Washing Machine supply document Catalog and Photographs (8), Mar. 2002—Partial translation.

*Primary Examiner*—Alexander Markoff
(74) *Attorney, Agent, or Firm*—Westerman, Hattori, Daniels & Adrian, LLP

(57) ABSTRACT

The present invention resides in a washing device constructed by a conveyer of a carrying-in side arranged in a frame, a reservoir lower portion having plural rails for holding the work and an ultrasonic generator arranged in this frame, each reservoir upper portion united with this reservoir lower portion, a raising-lowering device for raising and lowering each reservoir upper portion, an arm mechanism for work conveyance, a moving device for controlling advancing and retreating movements of the arm mechanism, a movable device for controlling a swinging return of the arm mechanism, and a conveyer of a carrying-out side for conveying a processed work. The conveyer and the rail of each reservoir lower portion are approximately arranged on the same face. The work is horizontally moved through this conveyer and the rail and is washed and dried by utilizing the union of each reservoir lower portion and each reservoir upper portion. Accordingly, the work is simplified and made at high speed and is facilitated by performing the washing, the processing and the movement in the horizontal movement. A dividing type using the reservoir lower-upper portion is used, and ultrasonic washing is performed by supplying a fluid to the reservoir and the function of the ultrasonic device is enlarged.

1 Claim, 18 Drawing Sheets

U.S. PATENT DOCUMENTS

| | | |
|---|---|---|
| 3,625,233 A | 12/1971 | Southard |
| 3,688,782 A | 9/1972 | Smith |
| 3,813,895 A | 6/1974 | Klee et al. |
| 4,936,328 A | 6/1990 | Yatabe |
| 5,014,726 A | 5/1991 | Lindvall |
| 5,569,330 A | 10/1996 | Schild et al. |
| 6,164,297 A | 12/2000 | Kamikawa |
| 7,290,551 B2 * | 11/2007 | Kataoka ............ 134/200 |
| 7,628,867 B2 * | 12/2009 | Kataoka ............ 134/32 |

* cited by examiner

WASHING DEVICE AND ITS WORK CONVEYING METHOD

This is a division of application Ser. No. 10/304,003, filed Nov. 26, 2002 now U.S. Pat. No. 7,290,551.

BACKGROUND OF THE INVENTION

1. Field of the Invention

The present invention relates to a washing device for approximately horizontally moving a washing object (a work, e.g., parts, glass, a liquid crystal plate, etc.) by vertically moving a reservoir upper portion with respect to a reservoir lower portion every one washing cycle, and removing dust floated within a fluid, etc. by returning the fluid (washing water, a washing liquid, a rinse liquid, etc.) of the reservoir lower-upper portion to a tank, and also relates to a work conveying method of this washing device.

2. Description of the Related Art

FIG. 19 shows one example of a general article as a conventional washing device. Namely, this example shows a badge system. The summary of this system will be explained. A washing reservoir is filled with a fluid, and a washing object (set to a work) is dipped into this fluid and is washed by an ultrasonic wave in this dipping state. In this construction, there were the following problems. Namely, since the work is horizontally moved and vertically moved and is dipped into the washing reservoir, conveying device and operation become complicated, or a time for the conveyance is taken and working efficiency is bad. Further, in this construction, the work is moved in a composite direction of the horizontal movement, etc. In accordance with this composite movement, the enlargement of an arranging space of the device, complicatedness of the device, or an increase in the scale of a plant, etc. are caused. As mentioned above, it is difficult to remove dust, dirt, etc. floated or mixed into the fluid in the badge system.

There is a work (e.g., glass, a liquid crystal plate, etc.) of a flat plate shape as a special article. In this one example, the work is washed while the work is conveyed by utilizing chain conveyance and a guide member. In this method, problems exist in that traces of the guide member are left in the work and become a factor of the generation of inferior goods, and after-treatment is required so that a reduction in efficiency and an increase in cost are caused. Further, in this horizontal system, a hole and a notch portion are formed in the washing reservoir, and the work is moved and the washing liquid, etc. are overflowed by utilizing this hole. Accordingly, problems exist in that the overflow of the washing liquid is often utilized, and the supply amount is increased and the washing tank is large-sized, or the area of an opening portion is limited.

There is a washing device of JP-A-7-136606 as a prior patent literature having the reservoir of a divisional type. In this literature, a divisional type reservoir having a fluid supply hose and a drain pipe therein and divided into two in the horizontal direction is arranged. An ultrasonic vibrator horizontally moved and raised and lowered is arranged in this divisional type reservoir, and a dry rotary table is arranged in the divisional type reservoir so as to perform washing and drying operations in one reservoir.

As mentioned above, there were evils caused by the composite movement in the construction of the conventional dipping system. For example, the arranging space of the device is enlarged, and the device becomes complicated or the plant is large-sized, etc. Further, in the construction for utilizing the conventional chain conveyance, etc., problems exist in that traces are left and become a factor of the generation of inferior goods, and after-treatment is required and a reduction in efficiency is caused, or the area of the opening portion is limited, etc.

The literature is set to the divisional type and adopts a construction for repeating the mutual movement and union of each reservoir and a construction for making the horizontal and raising and lowering movements in setting or resetting the ultrasonic vibrator to the divisional type reservoir. Accordingly, the device and the work become complicated and it takes time to make the work and the washing, etc.

BRIEF DESCRIPTION OF THE DRAWINGS

FIG. 1A shows the raising state of a reservoir upper portion. FIG. 1B shows a state in which the reservoir upper portion is lowered and united with a reservoir lower portion after a work is conveyed into the reservoir lower portion. FIG. 1C shows a washing state of the work. FIG. 1D shows the raising state of the reservoir upper portion after the washing. FIG. 1E shows a state in which the work is conveyed outside the reservoir lower portion. FIG. 1A' shows a state in which the reservoir upper portion in FIG. 1A is seen from a plane.

DESCRIPTION OF THE PREFERRED EMBODIMENTS

The embodiment modes of the present invention will next be explained.

Figure 1:
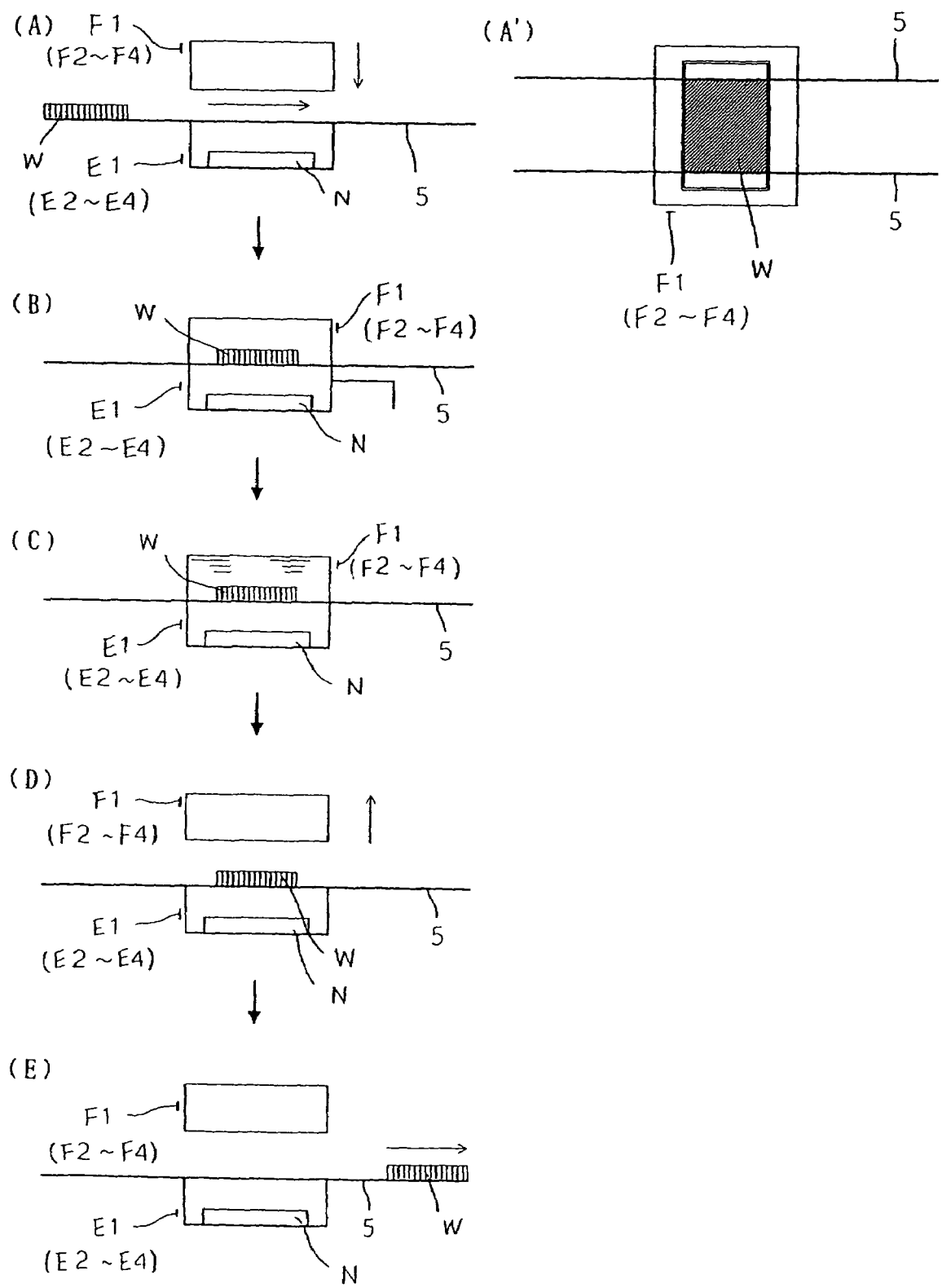
FIGS. 1A to 1E are typical views for explaining the entire operation of a washing device in one example of the present invention.

As shown in FIG. 1, a work is horizontally moved through a conveying means. When a separatable reservoir is set to an open state, this horizontally moved work is introduced into this separated reservoir (see FIG. 1A). The work is reliably and accurately set to the separated reservoir through this horizontal movement. In a completing state of this setting, the other separated reservoir is moved and integrally united with the separated reservoir (see FIG. 1B). A washing liquid for work washing is introduced into the reservoir by detecting this uniting state, and each processing of the work is performed by utilizing the washing liquid and an ultrasonic wave (see FIG. 1C). After this processing is terminated, the release of the union is advanced and the separated reservoir is moved (see FIG. 1D). The separated reservoir is stopped in a predetermined position by this movement, and is reset so that the processed work is horizontally moved by the work conveying means from the interior of the separated reservoir to the other separated reservoir (see FIG. 1E). There may be also a case in which the movement of the separated reservoir and the work conveyance of the processed work are simultaneously performed. After the washing of the work is terminated by performing the above explained operation once or plural times, the work is conveyed to the drying reservoir by performing an operation similar to the above operation, and drying processing is terminated by performing the above operation, e.g., the union and separation of the reservoir, the supply and discharge of a warm air, etc. (not shown in the drawings). The drying reservoir may be also set to an integral type. Thereafter, the work is horizontally moved and is introduced into another conveying means by utilizing the work conveying means. Thus, the work is conveyed outside the device by this another conveying means (not shown in the drawings).

One example of the present invention will next be explained with reference to the drawings.

The present invention has main constructional elements constructed by a frame A (device), an outer reservoir B arranged in a base frame A1 of the frame A, carrying-in and carrying-out sides C, D of a conveying means arranged in this outer reservoir B, reservoir lower-upper portions E1·E1 to 4, F19·F1 to 4 (set to reservoir lower-upper portions E1 to 4, F1 to 4 in the explanation) of one or plural dividable reservoirs arranged in the outer reservoir B, an arm mechanism G, a moving means H for controlling forward and backward movements of this arm mechanism G, a movable means I for controlling swinging return of the arm mechanism G, a raising-lowering means J for raising and lowering the above reservoir upper portions F1 to 4, a washing liquid tank K (a tank for a first process) for storing e.g., a washing liquid, a rinse liquid tank L (a tank for a second process) and a rinse liquid tank M (a tank for a third process) for storing a rinse liquid, and one or plural ultrasonic generators N (ultrasonic vibrator) arranged in a suitable position of the above dividable reservoir, or an unillustrated nozzle device. The arm mechanism G is located in the rear portion of the above dividable reservoir for conveying a work W arranged in an upper frame A2 of the above frame A, and acts a part of the above conveying means. The reservoir lower-upper portions E1 to 4, F1 to 4 are simultaneously operated in principle. The number of reservoir lower-upper portions E1 to 4, F1 to 4, their shapes, sizes, etc. are increased and decreased in accordance with the using modes of processing objects, processing methods, etc., or the carrying-in and carrying-out sides C, D, the arrangement or operations, procedures, etc. of the reservoir lower-upper portions E1 to 4, F1 to 4 are different in accordance with washing methods, the washing modes of rinse washing, alkali washing, etc., the using modes, or processing liquids, etc., and are set to optimum structures. In any case, a washing device able to be used in many objects, etc. are formed. The bottom portion is opened in the case of the reservoir lower portion E3.

One example of each construction will next be explained.

1. The outer reservoir B will be explained.

Figure 2:
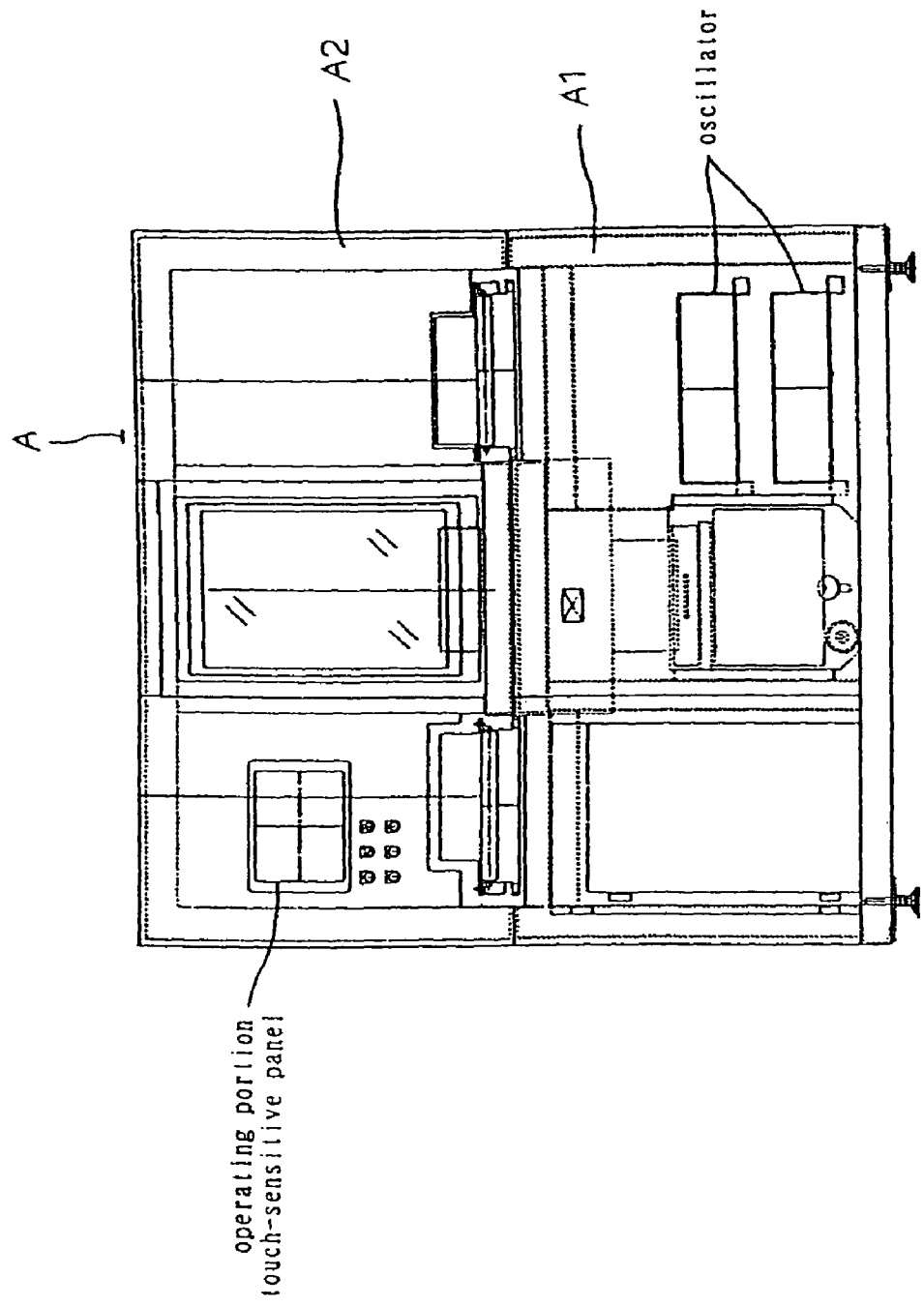
FIG. 2 is a front typical view for explaining one example of the entire washing device reduced in size.
Figure 5:
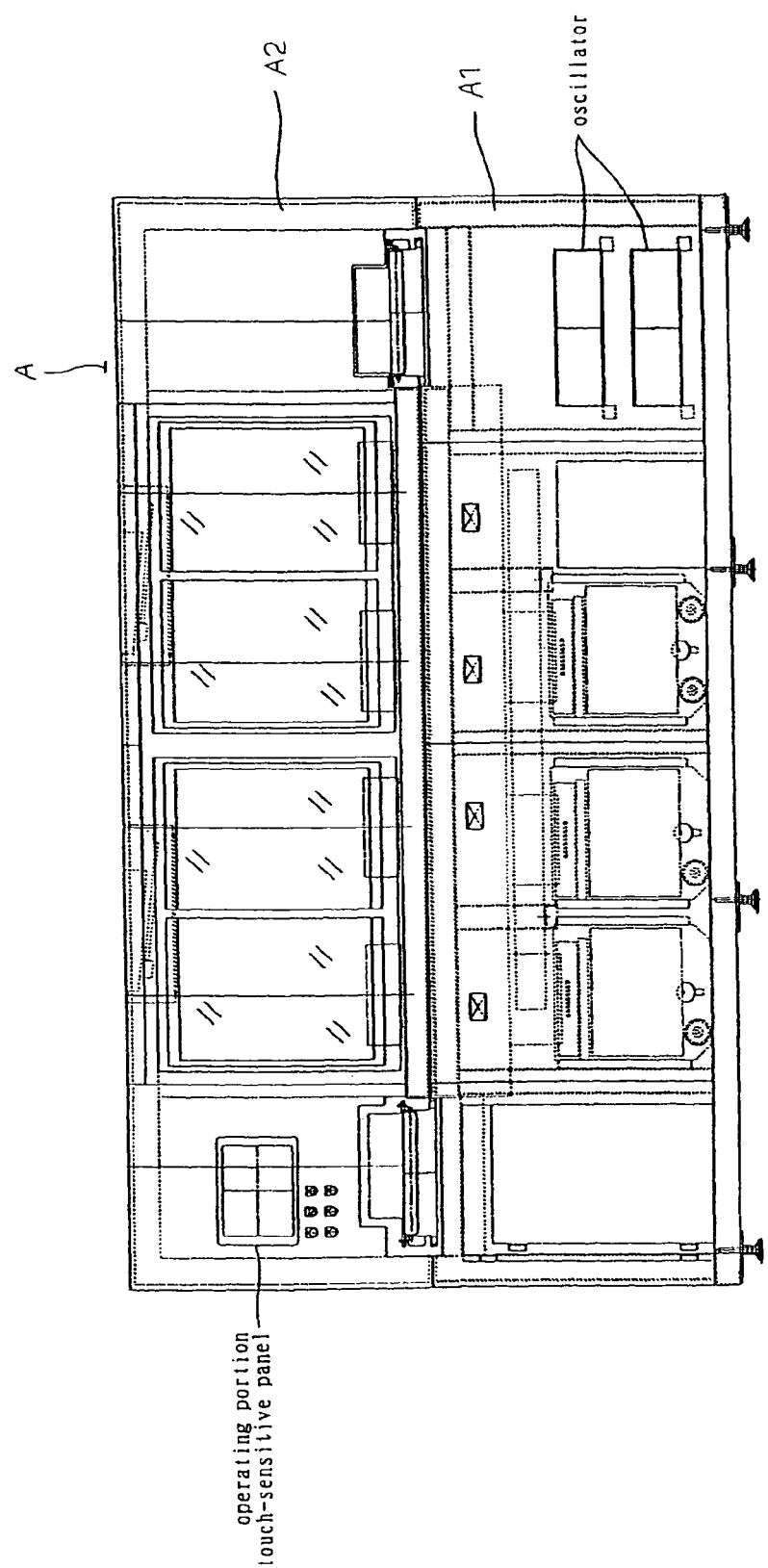
FIG. 5 is a front typical view for explaining another example of the entire washing device reduced in size.

As shown in FIGS. 2 and 5 (showing the figures of typical examples), this outer reservoir B is arranged in the base frame A1. The carrying-in side C is arranged in the carrying-in direction (the right-hand side of FIG. 3 and the upper side of FIG. 6) of this outer reservoir B. The carrying-out side D is arranged in the carrying-out direction (the left-hand side of FIG. 3 and the lower side of FIG. 6). This outer reservoir B is partitioned in accordance with the above reservoir lower portions E1 to 4. Reference numeral 1 designates a partition plate. Further, reference numeral 100 designates a discharge liquid port of the outer reservoir B.

2. The carrying-in side C will be explained.

Figure 3:
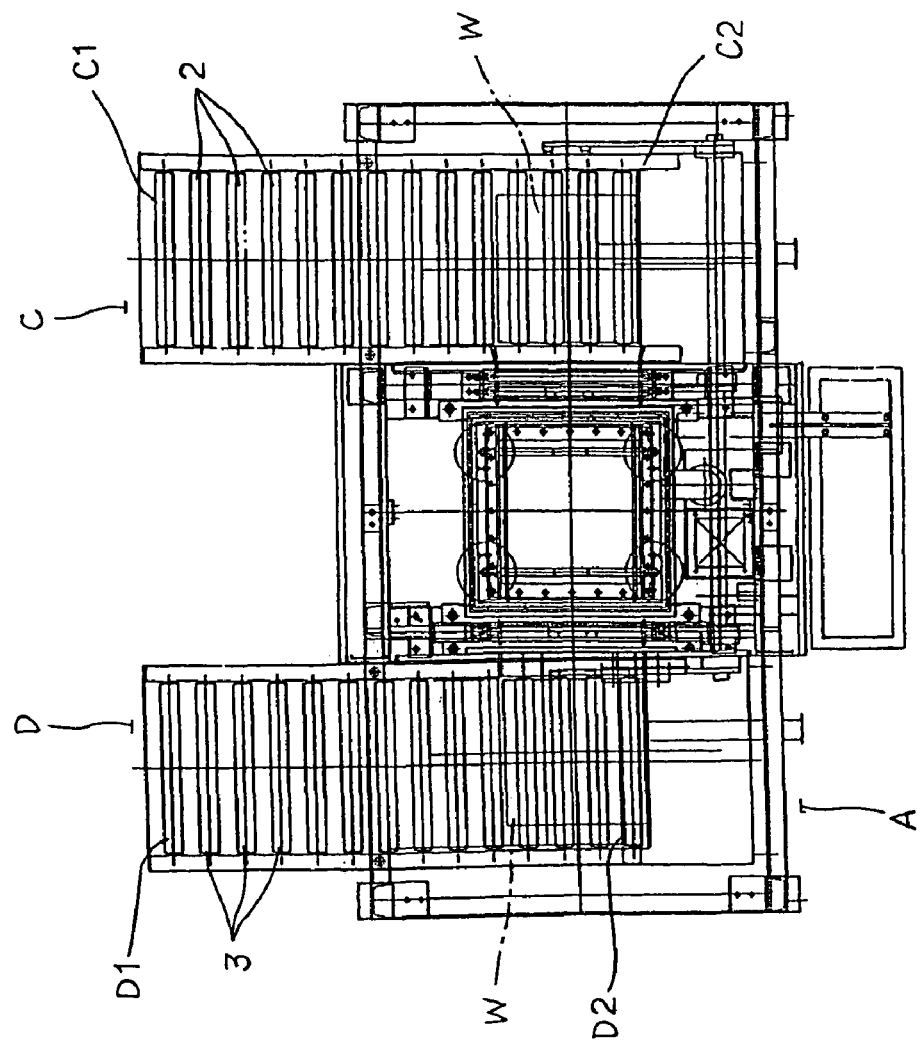
FIG. 3 is a plan view for explaining one example of the washing device.

As shown in FIG. 3, etc., this carrying-in side C is constructed by pivotally supporting many rollers 2 of an automatic rotary type. Reference numerals C1 and C2 respectively designate a carrying-in position (starting end) and a deep face. An unillustrated switch for stoppage is arranged on at least the deep face C2. The carrying-in side C can be also constructed by a belt conveyer, a rail, etc.

3. The carrying-out side D will be explained.

As shown in FIG. 3, etc., this carrying-out side D is constructed by pivotally supporting many rollers 3 of an automatic rotary type. Reference numerals D1 and D2 respectively designate a carrying-out position (terminal end) and a deep face. An unillustrated switch for stoppage is arranged on at least the deep face D2. The carrying-out side D can be also constructed by a belt conveyer, a rail, etc.

4. The reservoir lower portions E1 to 4 of several dividable reservoirs (washing reservoirs) arranged in the outer reservoir B will be explained.

In the examples of FIGS. 5 to 18, the reservoir lower portions E1 to 4 are constructed such that openings 4 (upper faces) of these reservoir lower portions E1 to 4 are about the same as roller faces of the above carrying-in side and carrying-out sides C, D, and the work W and a jig can be horizontally moved. A piping 40 (described later) is arranged in the bottom portion of each of reservoir lower portions E1 to E3. The washing liquid is flowed down from the reservoir lower portion E1, and the rinse liquid is flowed down from the reservoir lower portion E2, and the rinse liquid is flowed down from the reservoir lower portion E3. The reservoir upper portions F1 to 4 of the dividable reservoirs are raised and lowered by the raising-lowering means J described later, and are united with the reservoir lower portions E1 to 4. A flange piece 6 is arranged in each of these uniting portions so that a close attaching state is secured by this flange piece 6 and a flange piece 7 of each of the reservoir upper portions F1 to 4. Airtight property is secured by utilizing the joining of these flange pieces 6 and 7 so that the countermeasures of e.g., prevention of leakage and scattering of the washing liquid, seal of the uniting portion, the same construction and action as the reservoir of an integral type, or an increase in efficiency of drying, mechanical processing, assembly processing, etc. can be taken. There may be also a seal means to secure the close attaching state. A teflon material having a small amount of generated dust can be adopted as this seal means and can be fastened by an adhesive, a fastening tool, etc. The same mechanism as the above case is also constructed in this example. In the case of the flange piece 7 of each of the reservoir upper portions F1, F2, the flange piece 7 is also used as a groove 70 for the washing liquid, the rinse liquid, etc. The washing liquid and the rinse liquid are flowed down from one notched portion of this groove 70, and are flowed to the outer reservoir B. Further, a structure for preventing the leakage of the washing liquid, the rinse liquid, a warm air, etc. is formed by securing the close attaching state of the reservoir lower-upper portions E1 to 4, F1 to 4. In the drawings, reference numeral 5 designates a work holding rail approximately arranged on the same face in the opening 4 (upper face) of each of the reservoir lower portions E1 to 4. The work holding rail 5 is arranged on each of both sides in one direction, and secures the horizontal movement of the work W. If the same object (horizontal movement) can be attained, there is also a case in which the work holding rail 5 is arranged in another place of the device. The present invention is used for the washing using the overflow from the upper face of the dividable reservoir and/or a hole.

In the drawings, reference numeral 8 designates a nozzle for injecting the rinse liquid of rinse shower washing. The nozzle 8 is arranged in each of the reservoir lower-upper portions E3, F3, but is changed and/or increased and decreased if necessary. The reservoir lower-upper portions E4, F4 are drying reservoirs for the warm air and vacuum drying so that the warm air is supplied and pressure reduction processing is performed. In the drawings, reference numeral 9 designates a warm air discharge port.

The reservoir lower portions E1 to 4 can be also constructed such that these reservoir lower portions E1 to 4 are partitioned through an unillustrated partition plate arranged in the outer reservoir B. The partition plate can be constructed so as to be freely attached and detached.

Figure 4:
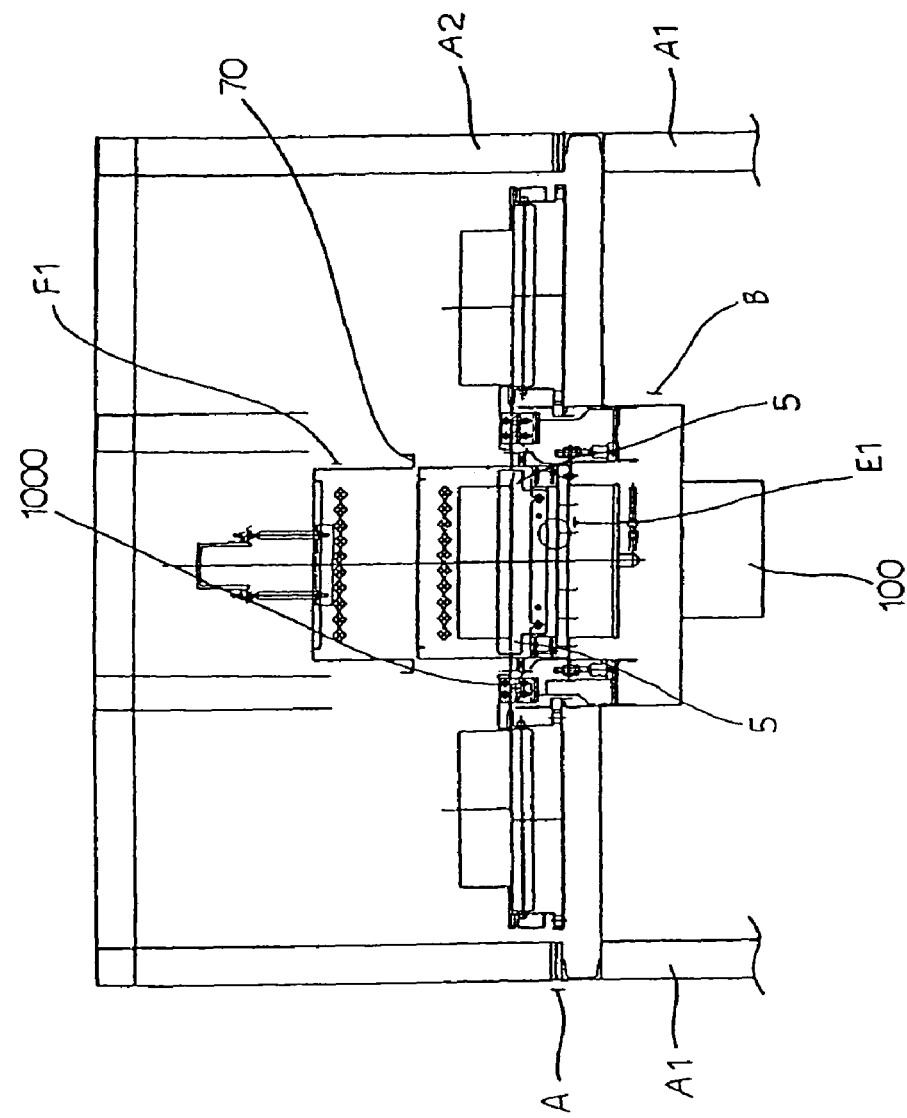
FIG. 4 is a side view for explaining one example of the washing device.

In the example of one dividable reservoir shown in FIGS. 2 to 4, etc., a combining structure of the reservoir lower portion E1 and the reservoir upper portion F1 is formed, and each processing is mainly performed by the reservoir lower portion E1 and the reservoir upper portion F1 of this one dividable reservoir. However, for example, in the case of the rinse shower washing and the drying processing, a means for adding another mechanism or conveying the work to another drying device, etc. is adopted.

5. The moving means H having a moving device for controlling the forward and backward movements of the arm mechanism G will be explained.

This moving means H is constructed by an arm supporting body 10 (bracket) arranged in the base frame A1, a guide rail 11 approximately arranged in parallel with the base frame A1 of the frame A arranged in this arm supporting body 10, a moving piece 12 movably arranged in this guide rail 11 in the horizontal direction Y, an arm moving body 13 arranged in this moving piece 12, a rack 14 (screwing face) arranged in the plane of this arm moving body 13, a gear 15 engaged with this rack 14, a motor 16 arranged in the base frame A1 and rotating this gear 15, an arm supporting rod 17 arranged in the above moving piece 12 and extended in the reservoir direction X, an arm attaching rod 18 pivotally supported by this arm supporting rod 17, and an arm mechanism G arranged in this arm attaching rod 18 and rising at a returning time. There is also a constructional example in which the moving means H of the arm mechanism G connects a cylinder and the arm attaching rod 18 through a coupling, and the arm attaching rod 18 is moved by the cylinder although this construction is not illustrated. The moving means H copes with the rotation of the arm attaching rod 18 by utilizing this coupling, or the rotation of the cylinder. There is also a constructional example in which the moving means of the arm mechanism G connects a link arranged in a cam to the arm attaching rod 18 and this arm attaching rod 18 is moved by the cam and the link although this construction is not illustrated. The other constructions are similar to those in the above example. The rack 14 and the gear 15 are one example of an operating means of the arm moving body 13. The work W can be horizontally moved by only this moving means H although this moving construction is not illustrated. For example, a cylinder, a movable lever, or a moving mechanism of pressing, movability of the cam and the link, etc. is used.

6. The movable means I having a movable device for controlling the swinging return of the arm mechanism G will be explained.

This movable means I is constructed by the arm supporting body 10 arranged in the base frame A1, the guide rail 11 approximately arranged in parallel with the base frame A1 of the frame A arranged in this arm supporting body 10, the moving piece 12 movably arranged in this guide rail 11 in the horizontal direction Y, the arm moving body 13 arranged in this moving piece 12, the cylinder 20 arranged in this arm moving body 13, the link 21 for fixing a piston rod 200 of this cylinder 20 thereto, and the arm attaching rod 18 for fixing a free end of this link 21 thereto. There is also a constructional example in which the movable means I of the arm mechanism G connects the link arranged in the cam to the arm attaching rod 18, and the arm attaching rod 18 is movably returned by the cam and the link although this construction is not illustrated. The other constructions are similar to those in the above example.

7. The raising-lowering means J having a raising-lowering device for controlling the raising and lowering movements of the reservoir upper portions F1 to 4 will be explained.

This raising-lowering means J is constructed by an elongated hole 22 formed in an upper frame A2, a raising-lowering framework 23 for raising and lowering this elongated hole 22, a guide body 24 arranged in the upper frame A2 and fitting a nip-supporting portion 230 arranged in this raising-lowering framework 23 with play, a rack 25 arranged in the raising-lowering framework 23, a gear 26 engaged with this rack 25, a rotating shaft 27 for supporting this gear 26, a motor 28 for rotating this rotating shaft 27, and supporting bodies 29, 30 arranged in the upper frame A2 and supporting this rotating shaft 27 and the motor 28. There is also a constructional example in which the raising-lowering framework 23 is raised and lowered by utilizing the cylinder, or a means of the cam and the link, etc. in the raising-lowering means J for raising and lowering the reservoir upper portions F1 to 4 although this construction is not illustrated. The other constructions are similar to those in the above example. The raising-lowering direction, the raising-lowering angle and the raising-lowering speed of the reservoir upper portions F1 to 4 using this raising-lowering means J, etc. are not limited. This raising-lowering means J may be movably arranged in the frame A such as the upper frame A2, etc. by adopting a hinge system, and may be also constructed so as to be freely moved (swung and returned) by utilizing a driving means such as an unillustrated cylinder so that the device can be simplified and operated at high speed or be made compact in size, etc.

8. The washing liquid tank K, the rinse liquid tank L and the rinse liquid tank M (sub-tank of each liquid) will be explained.

This washing liquid tank K is continuously connected to the reservoir lower portion E1 through pipings 40 to 42, and the piping 40 is utilized to return the washing liquid, and the pipings 41, 42 are utilized to supply the washing liquid. In the drawings, reference numerals 43, 44 and 45 respectively designate a heater, a pump and a piping for cleaned water. The rinse liquid tank L is continuously connected to the reservoir lower portion E2 through pipings 50 to 52, and the piping 50 is utilized to return the washing water, and the pipings 51, 52 are utilized to supply the rinse liquid. In the drawings, reference numerals 53, 54, 55 and 56 respectively designate a heater, a pump, a piping for pure water, and a deoxidizing device. Further, the rinse liquid tank M is continuously connected to the reservoir lower portion E3 through pipings 60, 61, and the piping 60 is utilized to return the washing water, and the piping 61 is utilized to supply the rinse liquid. Reference numerals 63, 64, 65 and 67 respectively designate a heater, a pump, a piping for pure water, and a partition plate. In the drawings, reference numeral 1000 designates a guide roller, and a roller face is located on the same face as the opening 4 of each of the reservoir lower portions E1 to 4, and contributes to the movements of the work W and a jig in the horizontal direction. A sub-tank is arranged in a tank group, and effective utilization of the washing liquid, etc., continuous washing, high speed washing, long time washing, or omission of the spaces of arrangements and devices, etc. can be performed by adopting a construction for pumping-up, supplying and discharging the washing liquid, etc. to the tank group.

One example of preferable washing, work and conveyance in this embodiment will next be explained.

Figure 6:
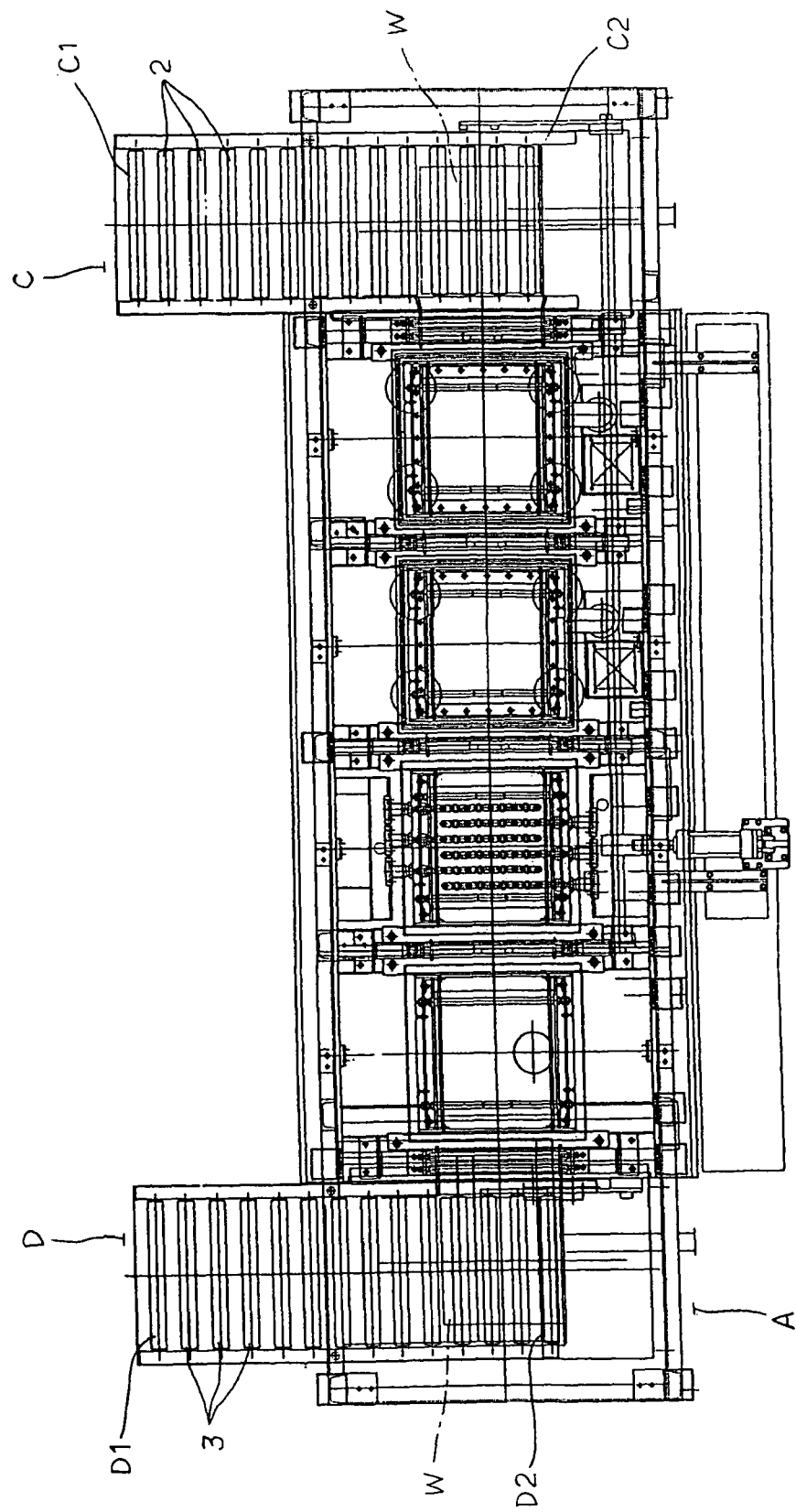
FIG. 6 is a plan view for explaining another example of the washing device.
Figure 7:
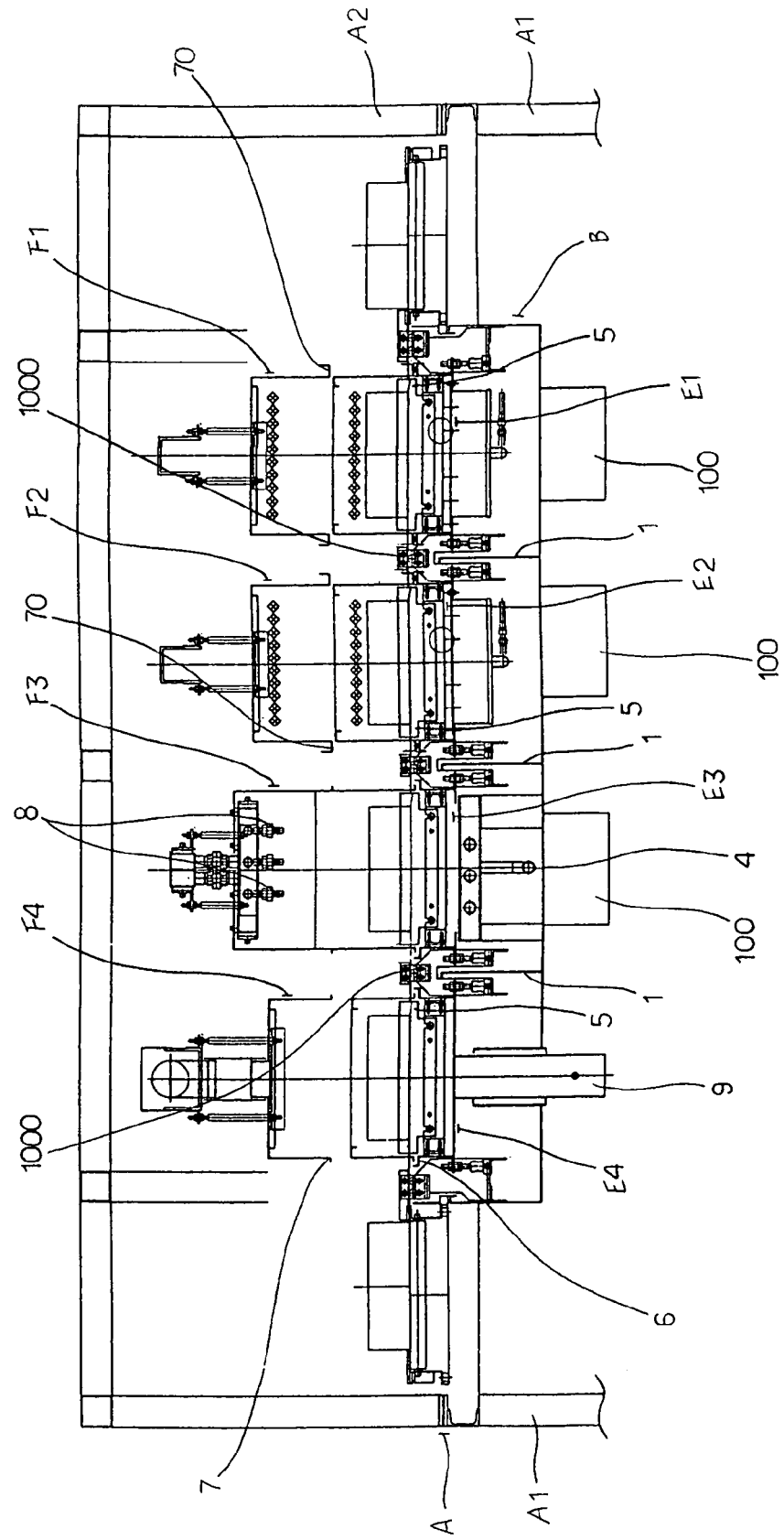
FIG. 7 is a side view for explaining another example of the washing device.
Figure 8:
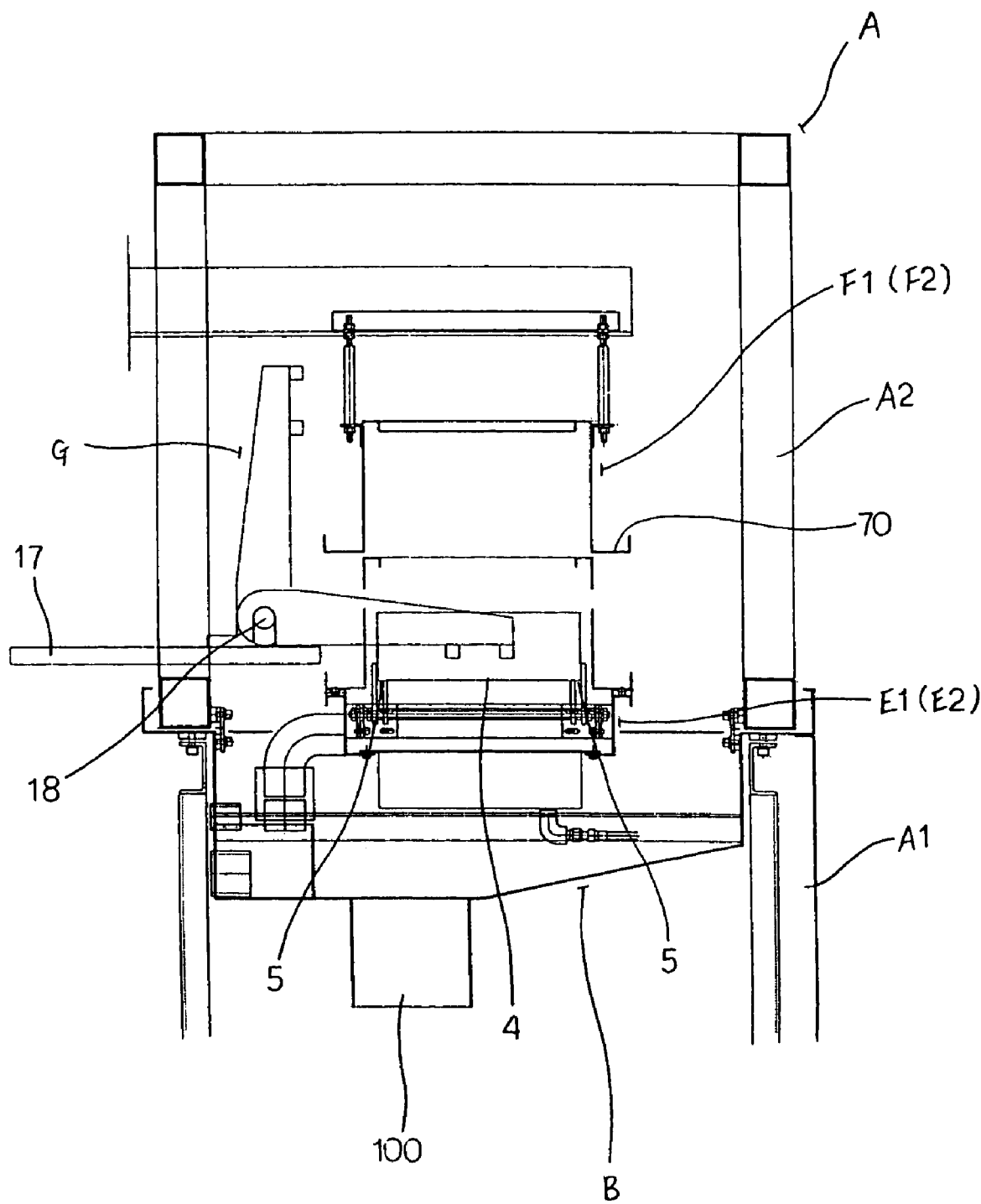
FIG. 8 is a typical view for explaining detergent ultrasonic washing or rinse ultrasonic washing in another example.
Figure 9:
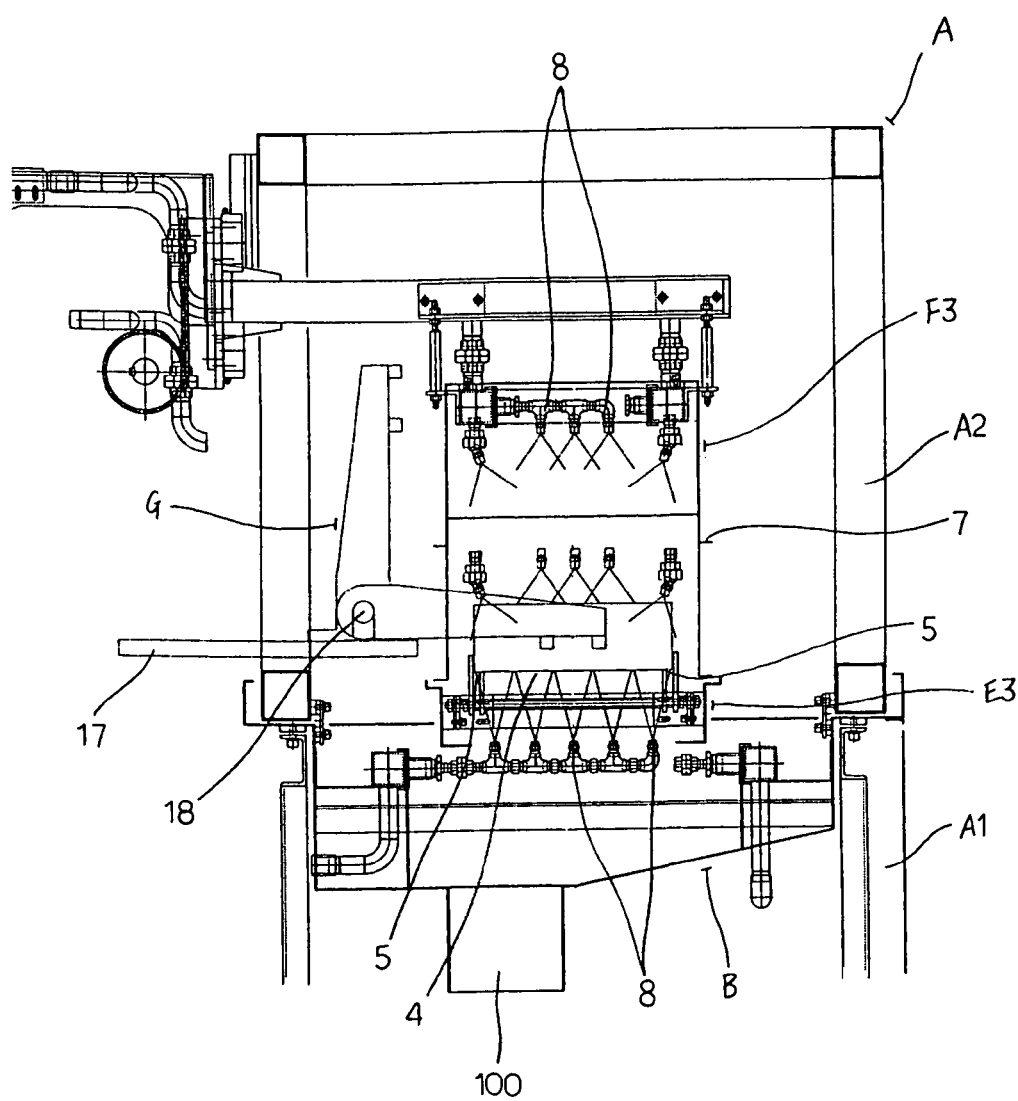
FIG. 9 is a typical view for explaining rinse shower washing in another example.
Figure 10:
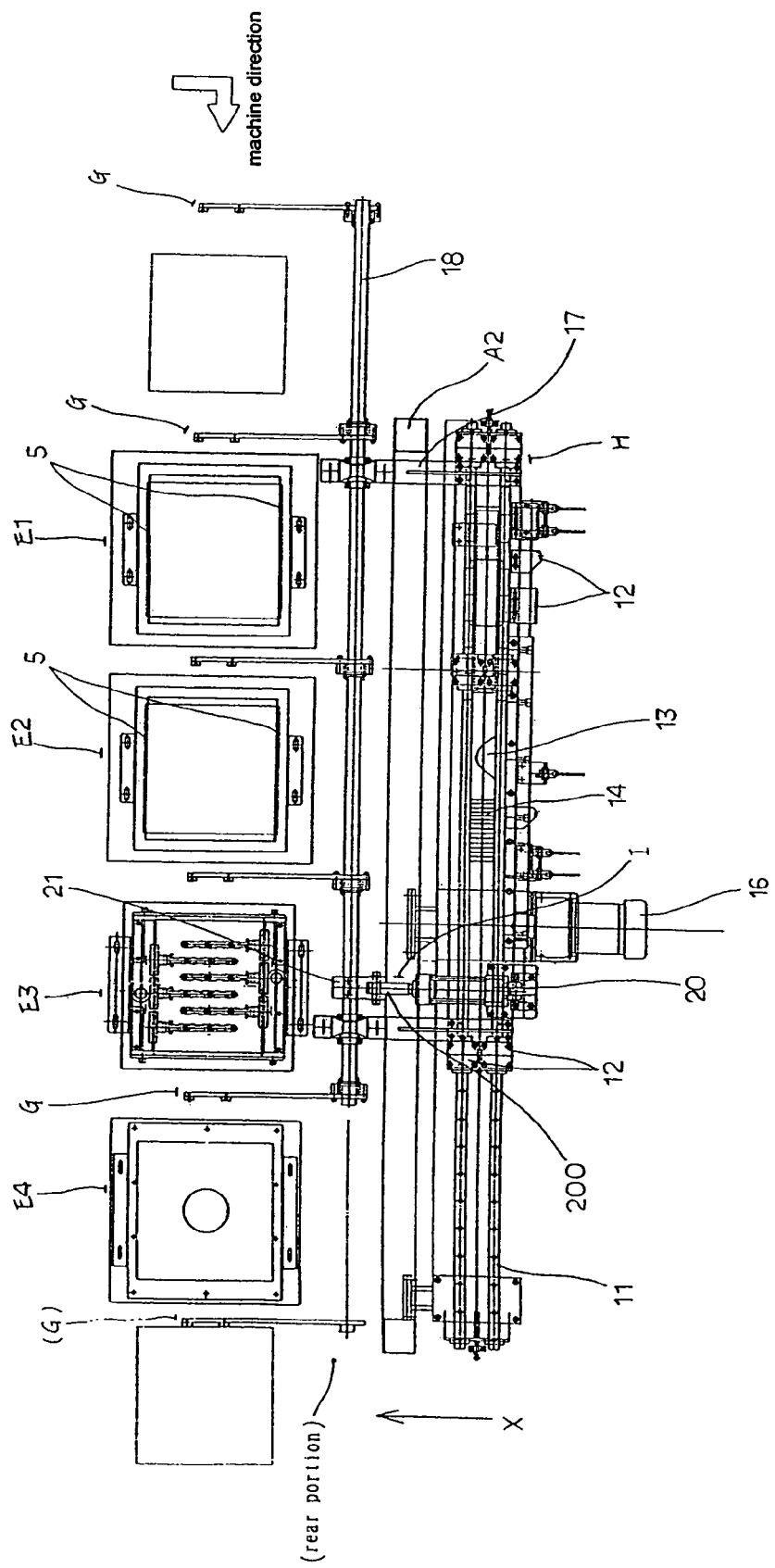
FIG. 10 is a partially broken plan typical view for explaining a moving-movable means of an arm mechanism of another example.
Figure 11:
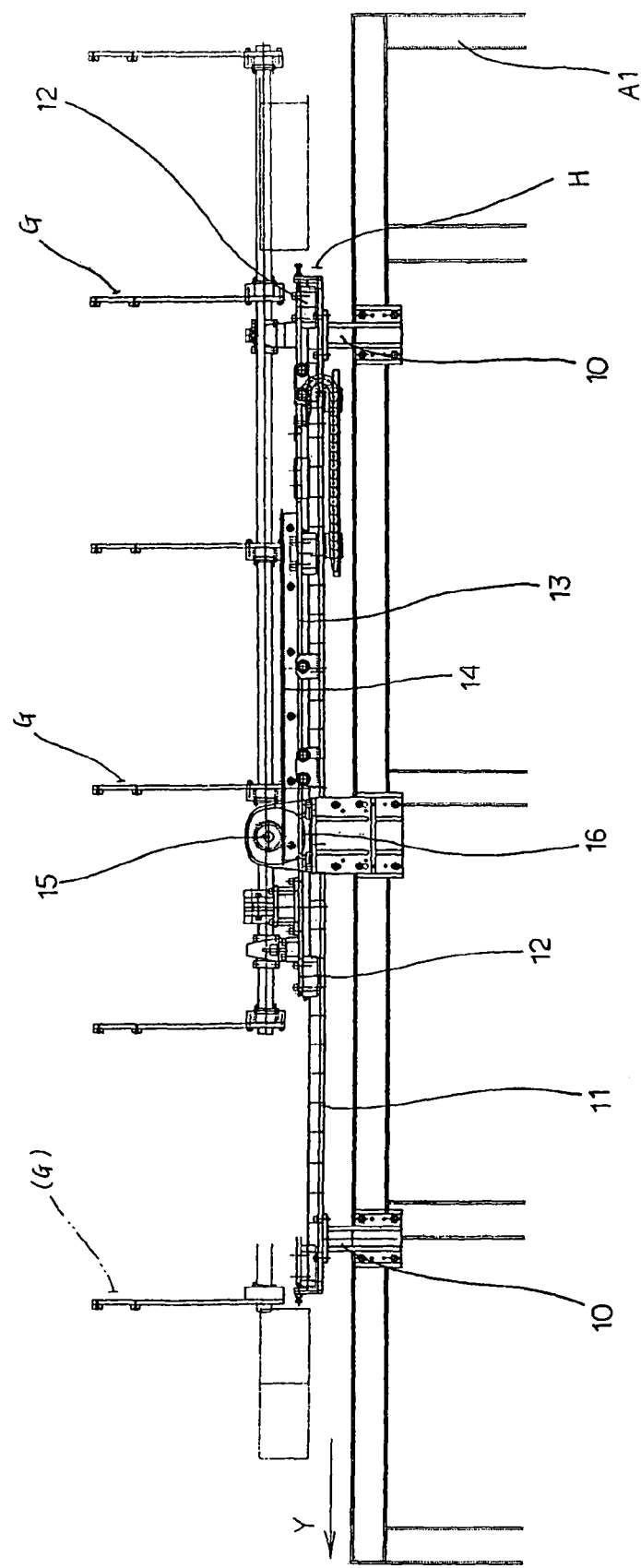
FIG. 11 is a side typical view for explaining the moving-movable means of the arm mechanism of another example.
Figure 12:
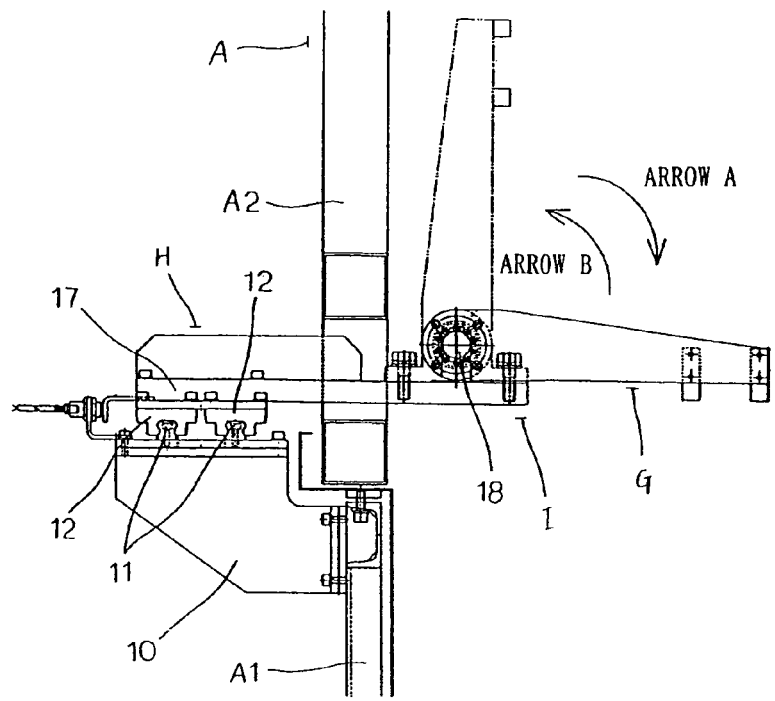
FIG. 12 is an enlarged front typical view for explaining movability in the movable means of the arm mechanism of another example.
Figure 13:
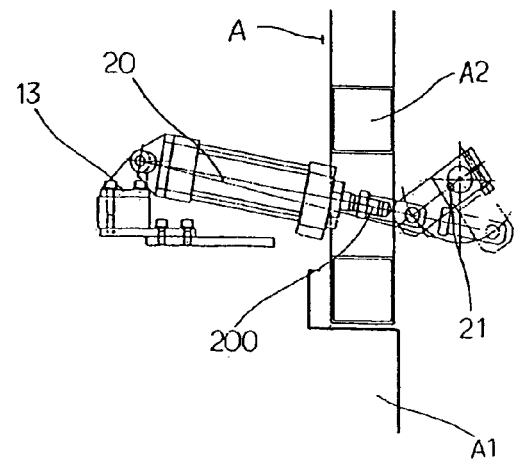
FIG. 13 is an enlarged front typical view for explaining a main portion in the movable means of the arm mechanism of another example.
Figure 14:
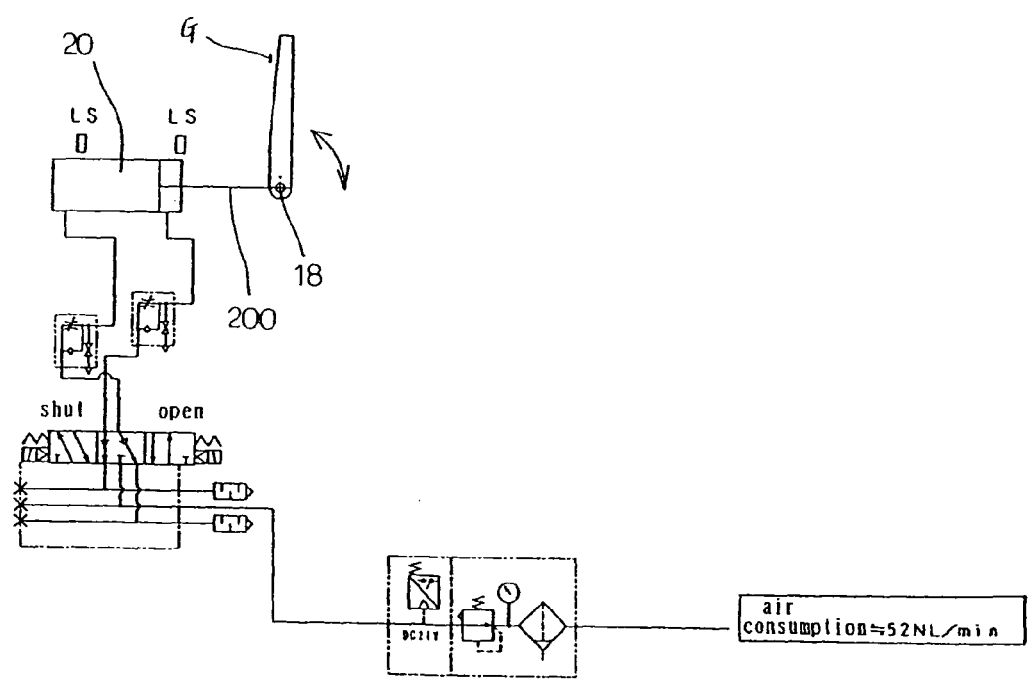
FIG. 14 is an enlarged front typical view for explaining a movable circuit in the movable means of the arm mechanism of another example.
Figure 15:
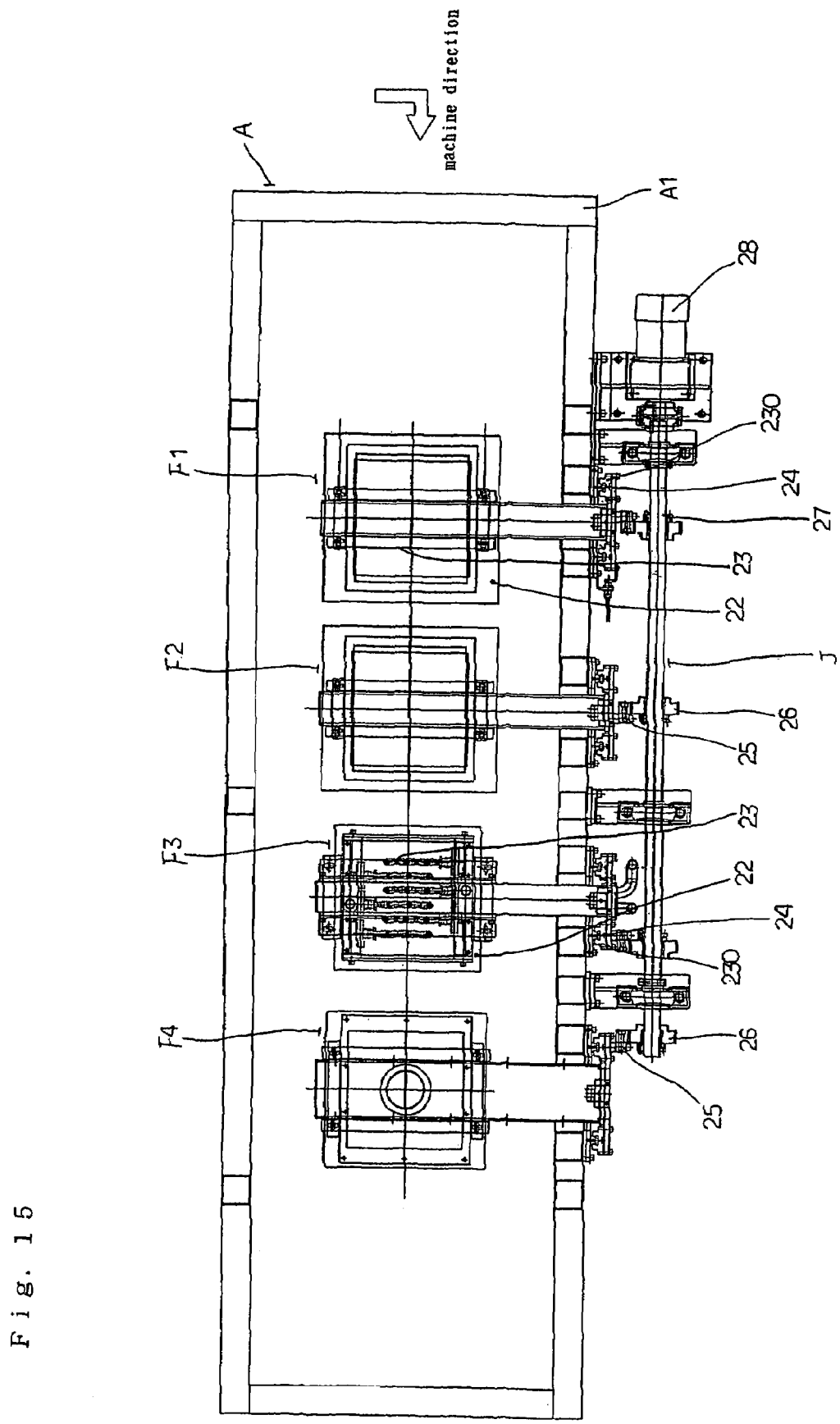
FIG. 15 is a plan typical view for explaining a raising-lowering means of the reservoir upper portion of another example.
Figure 16:
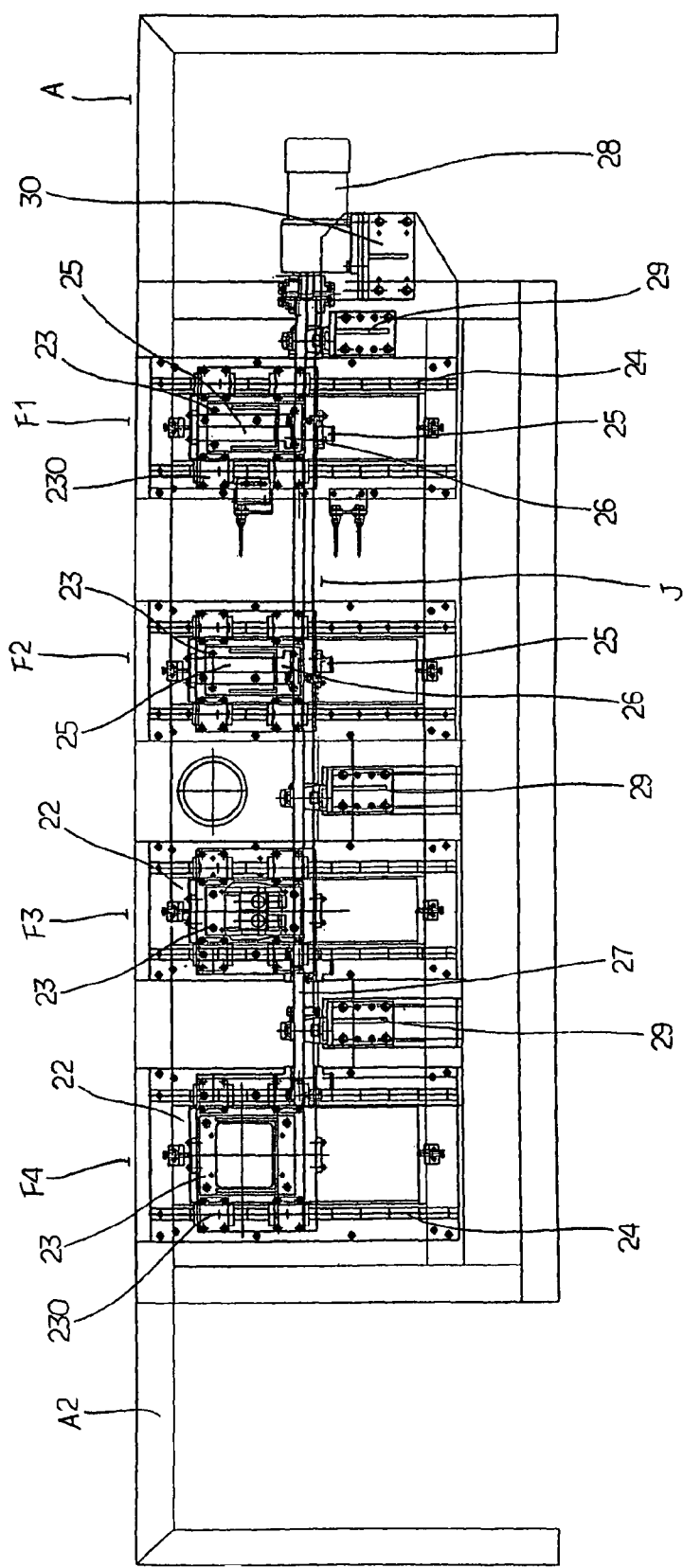
FIG. 16 is a side typical view for explaining the raising-lowering means of the reservoir upper portion of another example.
Figure 17:
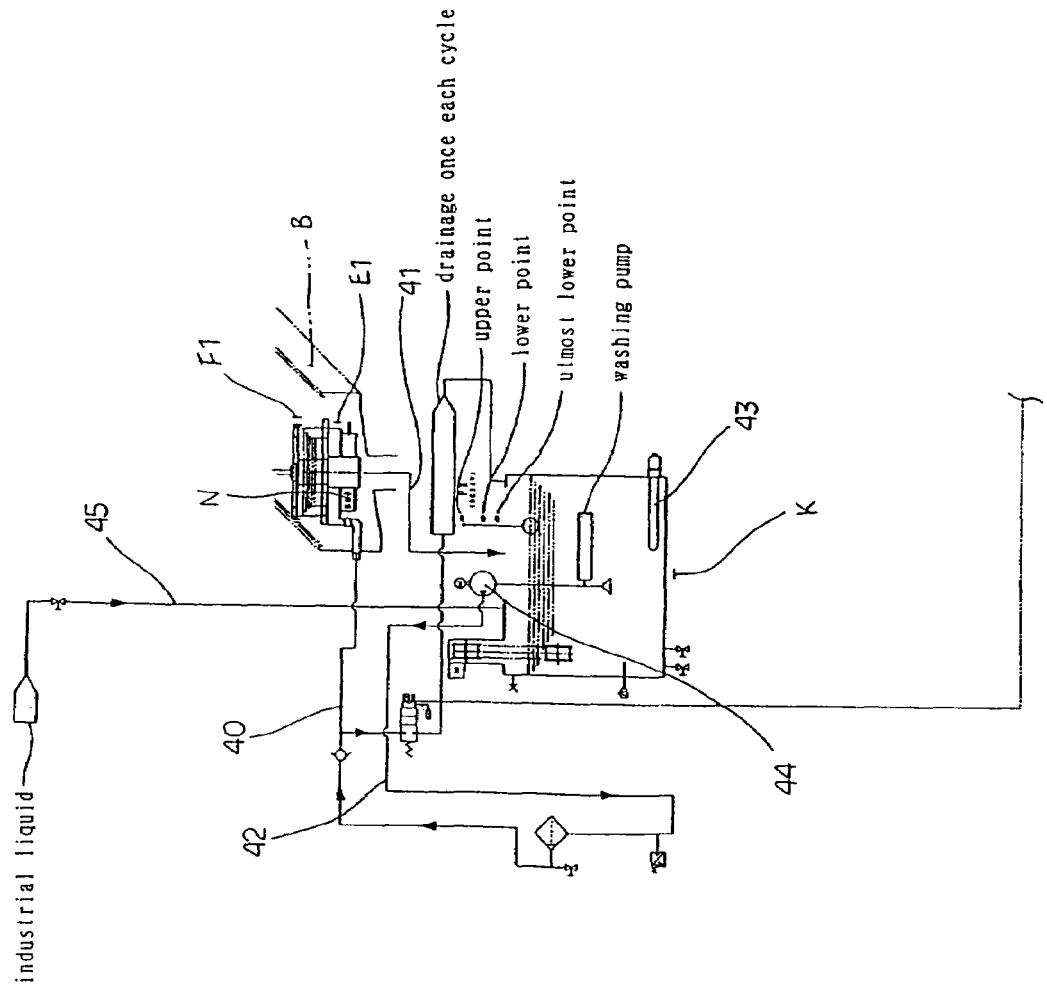
FIG. 17 is a flow chart for explaining detergent ultrasonic washing of another example.
Figure 18:
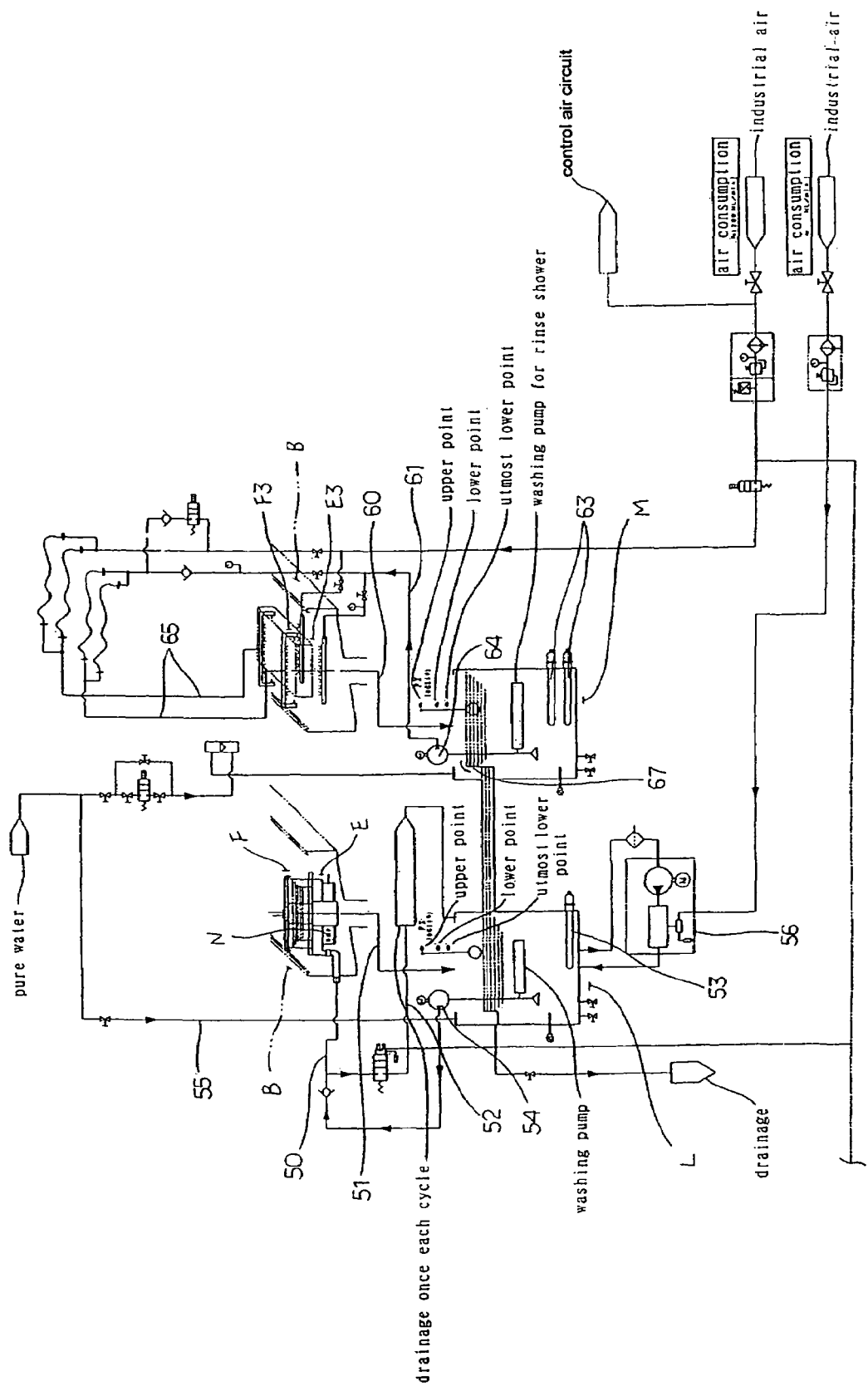
FIG. 18 is a flow chart for explaining rinse ultrasonic and rinse shower washing of another example.
Figure 19:
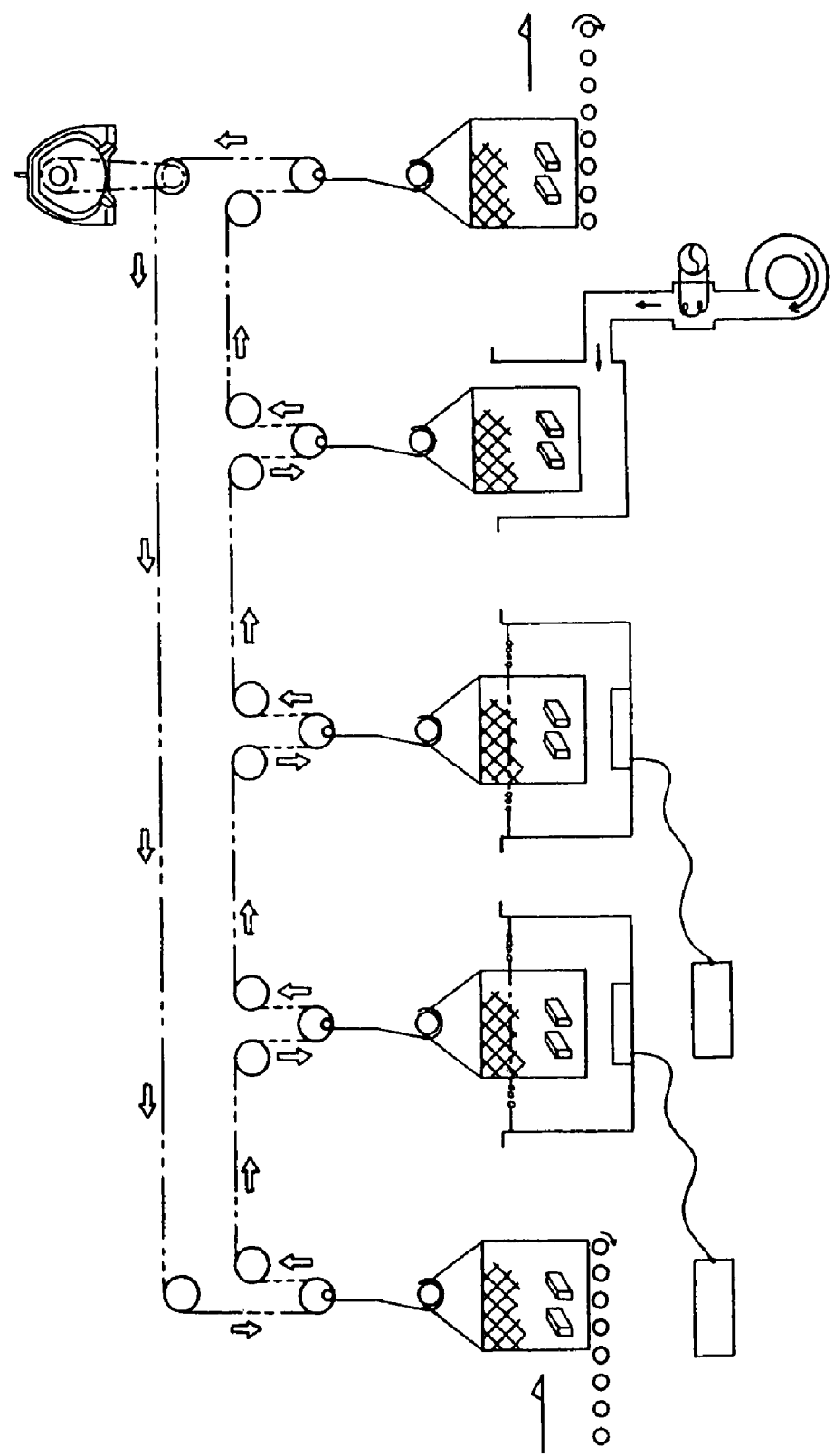
FIG. 19 is a typical view for explaining one example of the conventional washing device.

As shown in FIG. 6, when the work W is placed at a starting end of the carrying-in side (set to the carrying-in side) of the conveying means, this carrying-in side is automatically rotated and the work W is horizontally moved in the depth direction of the carrying-in side C. When the work W reaches a deep face position, the work W is stopped in a predetermined position by an unillustrated sensor. When this stoppage is confirmed, an unillustrated switch is operated and the cylinder 20 for the arm mechanism G is operated as shown in FIGS. 10 and 11. The arm attaching rod 18 is rotated by retreating the piston rod 200 of this cylinder 20 and returning the link 21. The arm G is swung in the direction of an arrow A in FIG. 12 by this rotation of the arm attaching rod 18, and reaches the side face of the work W (solid line of FIG. 10), and is stopped by the switch. After this stoppage of the arm mechanism G, the motor 16 for the arm mechanism G is rotated by operating this switch, etc. as shown in FIGS. 10 and 11. The gear 15 (spur gear) of an output shaft is rotated by this rotation of the motor 16, and the rack 14 is moved in the advancing direction by this rotation of the gear 15. Further, the arm moving body 13 and the arm attaching rod 18, etc. are advanced and moved in synchronization with this movement of the rack 14. Namely, the arm G1 is advanced and moved. The work W located in the deep face position on the carrying-in side C is advanced by a predetermined distance by this advancing movement of the arm G1 (the work W is horizontally moved toward the interior of the divided reservoir). The work W and the arm mechanism G are stopped by operating an unillustrated switch in this advancing position (an imaginary line of FIG. 10). After this stoppage, the reverse operation explained in FIGS. 10 and 11 is started, and the cylinder 20 for the arm mechanism G is operated, and the piston rod 200 of this cylinder 20 is advanced and the link 21 is returned so that the arm attaching rod 18 is reversely rotated (as one example). The arm mechanism G is returned in the direction of an arrow B in FIG. 12 by this reverse rotation of the arm attaching rod 18, and is separated from the side face of the work W, and is returned to the original position (an imaginary line of FIG. 10) so that each operation is terminated. Subsequently, the reverse operation explained in FIGS. 10 and 11 is started, and the motor 16 for the arm mechanism G is reversely rotated (as one example). The gear 15 of the output shaft is reversely rotated by this reverse rotation of the motor 16, and the rack 14 is moved in the backward direction by this reverse rotation of the gear 15. Further, the arm attaching rod 18 is retreated in synchronization with this movement of the rack 14. Namely, the arm G1 is retreated. The arm G1, the arm attaching rod 18, the arm supporting rod 17, etc. are returned to the original positions (solid line of FIG. 10) by this retreating movement of this arm G1, and each operation and the horizontal movement toward the interior of the divided reservoir of the work W are terminated.

At a stage at which the work W reaches a detergent ultrasonic washing process and is placed on the work holding rail 5 of the reservoir lower portion E1 by utilizing the moving-movable means of this arm mechanism G1, the motor 28 is rotated by the operation of a switch, and the gear 26 arranged in the output shaft of this motor 28 is rotated and the rack 25 is lowered. This rack 25 is arranged in the raising-lowering framework 23, and is lowered as it is by lowering the rack 25. This raising-lowering framework 23 lowers the elongated hole 22 formed in the upper frame A2 with the guide body 24 as a guide. The reservoir upper portion F1 is sequentially lowered through the lowering movement of this raising-lowering framework 23, and is stopped by the operation of an unillustrated switch. In this stoppage, the reservoir upper portion F1 and the reservoir lower portion E1 are united and the work W is held by this united reservoir. Since the work W is supported by the work holding rail 5 and is arranged so as to be depressed in the reservoir lower portion E1, the attenuation of an ultrasonic wave is characteristically small. Further, a problem with respect to the horizontal conveyance about the work holding rail 5 can be also dissolved. In the state in which the reservoir lower-upper portions E1, F1 are united, the washing liquid constructed by the cleaned water and/or the detergent is sequentially supplied toward this reservoir lower portion E1, and the work W is washed by utilizing the vibration of the ultrasonic oscillator while the washing liquid is discharged from a hole of the reservoir upper portion F1 (while miscellaneous things floated in the washing water, etc. are excluded). Thus, this washing is terminated. After this termination, the motor 28 is reversely rotated by the operation of the switch, and the gear 26 arranged in the output shaft of this motor 28 is reversely rotated and raises the rack 25. The raising-lowering framework 23 is raised as it is by raising the rack 25, and raises the elongated hole 22 formed in the upper frame A2 with the guide body 24 as a guide. At this raising time, the washing liquid is flowed down into the dividable reservoir. The reservoir upper portion F1 is sequentially raised through the raising of this raising-lowering framework 23, and is stopped by the operation of the unillustrated switch. In this stoppage, the reservoir upper portion F1 and the reservoir lower portion E1 are separated from each other. The washing liquid of the outer reservoir B and the reservoir lower portion E1 is returned to the washing liquid tank K through the piping 50. For example, the washing as the first process is terminated by this series of operations (operations constructed by the swinging return and the advancing and retreating movements of the arm W, the raising-lowering movement of the reservoir upper portion F1, or the supply and the discharge of the washing liquid, etc.). The union is reliably performed, and the seal is facilitated and dirt, etc. can be prevented by widening the area of a joining (uniting) portion of the reservoir lower-upper portions E1, F1. Further, the attachment of miscellaneous things included in the washing liquid to the work W is removed and beautiful washing is attained.

When this first process is terminated, it proceeds to a second process as the rinse washing. Accordingly, it is necessary to transfer the work W located in the reservoir lower portion E1 of the first process to this second process. It is also necessary to transfer the next work W located at a starting end C1 on the carrying-in side C in the depth direction on the carrying-in side C. Therefore, as mentioned above, the work W in this first process is transferred to the second process, and the next work W located in a carrying-in position on the carrying-in side C is transferred to the position of a deep face C2 on this carrying-in side by the swinging movement and the advancing movement of the arm. After this transfer, similar to the above example, the operation of the arm mechanism C in this second process is stopped by returning the arm C1 to the original position by the return and the retreating movement of the arm C1. On the other hand, the rinse washing is performed with respect to the work W located in the reservoir lower portion E2. The flow of the rinse liquid in this rinse washing, the raising-lowering movement of the reservoir upper portion F2 and the flow of the rinse liquid after the rinse washing are similar to those in the washing operation of the above first process. The rinse washing as the second process is terminated by this series of operations. The rinse liquid is effectively utilized and cost is reduced and rationalization, etc. are performed by utilizing (cascade flow) the used rinse liquid of the rinse shower washing described later.

When this second process is terminated, it proceeds to a third process called the rinse shower washing. Accordingly, it is necessary to transfer the work W located in the reservoir lower portion E2 of the second process to this third process. It is also necessary to transfer the next work W located in the carrying-in position on the carrying-in side C in the depth direction on the carrying-in side C. In this work, the work W of the second process is transferred to the third process, and the next work W located in the carrying-in position on the carrying-in side C is transferred to the position of a deep face C2 on this carrying-in side by the swinging movement and the advancing movement of the above arm. After this transfer, similar to the above example, the operation of the arm mechanism G in this third process is stopped by returning the arm G1 to the original position by the return and the retreating movement of the arm G1. On the other hand, the rinse shower washing is performed with respect to the work W located in the reservoir lower portion E3, and the work W of the third process is washed from a nozzle 8 in at least one direction or two directions (upper and lower directions), multi-directions, etc. This washing is performed to avoid dirt of the rinse liquid from the outside air and other pollutions, etc., or utilize this liquid as the rinse liquid in the above second process, etc. as a structure requiring no waste liquid from a hole and/or a seal type reservoir structure. The flow of the rinse liquid in this rinse shower washing and the raising-lowering movement of the reservoir upper portion F3 and the flow of the rinse liquid after the rinse washing are similar to those in the washing operation of the above first process. In this case, the used rinse liquid used in this rinse shower washing is supplied to the rinse liquid tank and is utilized as the rinse liquid for the rinse washing (cascade flow). The rinse shower washing as the third process is terminated by this series of operations.

When this third process is terminated, it proceeds to the fourth process of drying. Accordingly, it is necessary to transfer the work W located in the reservoir lower portion E3 of the third process to this fourth process. It is also necessary to transfer the new next work W located in the carrying-in position on the carrying-in side C in the depth direction on the carrying-in side. In this work, the work W of this third process is transferred to the fourth process, and the new next work W located in the carrying-in position on the carrying-in side C is transferred to the position of a deep face C2 on this carrying-in side C by the swinging movement and the advancing movement of the above arm mechanism G. After this transfer, similar to the above example, the operation of the arm mechanism G in this fourth process is stopped (the work W is horizontally moved toward the exterior of the divided reservoir) by returning the arm mechanism G to the original position by the return and the retreating movement of the arm mechanism G. Thereafter, similar to the above first process, the reservoir upper portion F4 is lowered and the drying processing of the work W is performed in a state in which the reservoir upper portion F4 is united with the reservoir lower portion E4. The operations after this dying processing is terminated, are similar to those in the washing operation of the above first process. The drying as the fourth process and the horizontal movement of the work W toward the exterior of the divided reservoir are terminated by this series of operations.

The washing processing of the work W in the illustrated example is terminated in the above first to fourth processes. After this termination, the processed work W reaches the carrying-out side D (set to the carrying-out side) of the conveying means from the fourth process. Accordingly, it is necessary to transfer the work W located in the reservoir lower portion of the fourth process to this carrying-out side D. It is also necessary to transfer the final work W (set to be final in this one example) located in the carrying-in position on the carrying-in side C in the depth direction on the carrying-in side C. In this work, with respect to the work W of the fourth process and the final work W, the work W of this fourth process is sent to the position of a deep face D2 on the carrying-out side D by the swinging movement and the advancing movement of the above arm mechanism G. After this transfer, similar to the above example, the operation of the arm mechanism G in this fourth process is stopped by returning the arm mechanism G to the original position by the return of the arm mechanism G and the retreating movement. The next work W for the washing supplied to the carrying-in position on the carrying-in side C is sent to the position of the deep face C2 through the operation of the roller 2, etc. on the carrying-in side C. Thereafter, operations such as the raising of the reservoir upper portion F4, etc. are performed. The processed work W reaching the position of the deep face D2 on the carrying-out side D is sent to a terminal end D1 through the operation of the roller 3, etc. on the carrying-out side D.

The carrying-in side C, the first to fourth processes and the carrying-out side D individually explained above constitute a series of flows, and the washing processing and the drying processing of the work W are terminated by terminating these flows. Accordingly, the work W is automatically carried in, processed and carried out on the basis of this series of flows. In the present invention, the reservoir for the detergent ultrasonic, rinse ultrasonic and rinse shower washings, and a driving section such as the moving-movable means H·I of the arm mechanism G, the raising-lowering means J of the reservoir upper portions F1 to 4, etc. are separated from each other, and the reservoir for the detergent ultrasonic, rinse ultrasonic and rinse shower washings is covered. Accordingly, pollution due to dust, a mote, foreign matters (set to a dust kind) from the outside air, the driving section, etc. is removed, and the dirt of the washing liquid, the work W, the dividable reservoir or the outer reservoir B is prevented, and the number of cleaning operations is reduced or maintenance is facilitated, etc. Further, there is an example in which an air cylinder is utilized in the driving section to prevent the generation of the dust.

A first embodiment of the invention resides in a washing device comprising conveying means of a carrying-in side for horizontally moving a work into a reservoir; a reservoir constructed by a reservoir upper portion and a reservoir lower portion able to be vertically divided; a work holding rail approximately arranged in a face position with respect to the reservoir lower portion; and conveying means of a carrying-out side for horizontally moving the work into the divided reservoir, or horizontally moving this work toward the exterior of the divided reservoir. Accordingly, the first embodiment of the invention is characterized in that a work is simplified and made at high speed and is facilitated, etc. by performing washing, processing and movements by utilizing the vertical movement and the horizontal movement of the reservoir upper portion every processing, or dust floated or mixed into a processing liquid is removed, and there is no limit in the area of an opening portion by adjusting and/or reducing the supply amount of a washing liquid, etc.

A second embodiment of the invention resides in a washing device in which the conveying means has an arm mechanism constructed by moving means advanced and retreated and movable means swung and returned. Accordingly, the second embodiment can provide an optimum conveying means for reliably executing the invention according to the first embodiment.

A third embodiment of the invention resides in a washing device in which the moving means of the arm mechanism is constructed by an arm supporting body arranged in a base device, a guide rail arranged in the arm supporting body approximately in parallel with the base frame, a moving piece movably arranged in the guide rail, an arm moving body arranged in the moving piece, a rack arranged in the arm moving body, a gear engaged with the rack, a motor for rotating the gear, an arm supporting body arranged in the arm moving body, and an arm attaching rod for fixing the arm mechanism pivotally supported by the arm mechanism supporting body. Accordingly, the third embodiment can provide the moving means of an optimum arm mechanism for reliably executing the invention according to the first embodiment.

A fourth embodiment of the invention resides in a washing device in which the movable means of the arm mechanism is constructed by an arm supporting body arranged in a base device, a guide rail arranged in the arm supporting body approximately in parallel with the base frame, a moving piece movably arranged in the guide rail, an arm moving body arranged in the moving piece, a cylinder arranged in the arm moving body, a link for fixing a piston rod of this cylinder thereto, and an arm attaching rod for arranging the arm mechanism for fixing a free end of the link thereto. Accordingly, the fourth embodiment can provide the movable means of an optimum arm mechanism for reliably executing the invention according to the first embodiment.

A fifth embodiment of the invention resides in a washing device in which the cylinder is set to an air cylinder. Accordingly, the fifth embodiment is characterized in that the generation of dust is avoided and the drop and entry of the generated dust into the reservoir and/or the interior of the reservoir are prevented.

A sixth embodiment of the invention resides in a washing device in which the reservoir able to be vertically divided is constructed by the reservoir lower portion and the reservoir upper portion, and this reservoir upper portion is vertically moved by raising-lowering means. Accordingly, the sixth embodiment can provide an optimum dividable reservoir for reliably executing the invention according to the first embodiment.

A seventh embodiment of the invention resides in a washing device in which the raising-lowering means of the reservoir upper portion is constructed by an elongated hole formed in an upper device, a raising-lowering framework for raising and lowering the elongated hole, a guide body for fitting a nip-supporting portion arranged in the raising-lowering framework with play and arranged in the upper device, a rack arranged in the raising-lowering framework, a gear engaged with the rack, a rotating shaft for supporting the gear, and a motor for rotating the rotating shaft. Accordingly, the seventh embodiment can provide the raising-lowering means of an optimum reservoir upper portion for reliably executing the invention according to the first embodiment.

An eighth embodiment of the invention resides in a washing device in which the dividable reservoir is constructed such that the seal of a reservoir lower-upper portion is secured by forming a flange piece in a uniting portion of the reservoir lower-upper portion. Accordingly, the eighth embodiment is characterized in that the leakage of a liquid is prevented, and the uniting portion is sealed and a role as the reservoir is played, or drying is efficiently performed and mechanical and assembly processings, etc. are performed.

A ninth embodiment of the invention resides in a washing device in which the washing device has the outer reservoir, and the dividable reservoir is arranged within this outer reservoir. Accordingly, the ninth embodiment is characterized in that this washing device is simplified and rationalized or is reduced in cost and is facilitated in maintenance, etc. by proposing another example of the dividable reservoir of the washing device.

A tenth embodiment of the invention resides in a washing device in which the washing device has plural dividable reservoirs set to a washing reservoir of at least detergent ultrasonic washing, rinse ultrasonic washing, rinse shower washing, etc., and a reservoir for warm air drying, vacuum drying, etc. Accordingly, the tenth embodiment is characterized in that cost is reduced and rationalization, etc. are performed while the dividable reservoir is specified and is effectively utilized.

An eleventh embodiment of the invention resides in a washing device in which processing fluids such as water including a detergent, washing water, pure water, super pure water, or a rinse liquid, an organic solvent, etc. are individually used and/or selectively commonly used in a detergent liquid used in the washing reservoir. Accordingly, a processing fluid able to attain the object of the ninth embodiment can be provided.

A twelfth embodiment of the invention resides in a washing method of a washing device in which the rinse liquid used in the rinse shower washing is overflowed from a partition plate arranged in the reservoir lower portion, and is supplied to a rinse liquid tank for the rinse washing, and is utilized in the rinse washing. Accordingly, the twelfth embodiment is characterized in that the rinse liquid is effectively utilized and cost is reduced and rationalization, etc. are performed by utilizing the used rinse liquid in the rinse shower washing as the rinse liquid for the rinse washing.

A thirteenth embodiment of the invention resides in a work conveying method utilizing a washing device constructed by conveying means of a carrying-in side, a dividable reservoir constructed by a reservoir upper portion and a reservoir lower portion, a work holding rail for horizontally moving the work arranged in the conveying means of the carrying-in side and the reservoir, and an arm mechanism for work conveyance for sequentially horizontally conveying the work from the conveying means of the carrying-in side to the reservoir lower portion or conveying means of a carrying-out side. The work is horizontally moved in the depth direction through the conveying means, and is stopped in a deep face position of the conveying means of the carrying-in side. After the stoppage, the arm mechanism is swung downward and reaches the side face of the work. Thereafter, the processed work is moved to the reservoir lower portion or a deep face position of the conveying means of the carrying-out side by horizontally moving the work in the transversal direction of the arm mechanism. After this movement of the work, the arm mechanism is swung upward, and is returned to the original position after this swinging movement. Thereafter, washing processing or drying processing is performed by uniting the lowered reservoir upper portion with the reservoir lower portion. The union is released by raising the reservoir upper portion after this washing or drying. Subsequently, a new work is supplied to a carrying-in position of the conveying means of the carrying-in side, and the processed work is moved from the deep face position of the conveying means of the carrying-out side to a carrying-out position. Thus, a series of conveying processings is performed. Accordingly, the thirteenth embodiment is characterized in that the invasion of dust dropped into the reservoir from the arm mechanism of the washing device, or the moving, movable and raising-lowering means, etc. is prevented in addition to the first embodiment.

What is claimed is:

1. A washing method using a washing device, comprising: providing a washing device comprising:
    - a first conveying means for horizontally carrying in a work, said first conveying means being arranged in a frame,
    - an outer reservoir arranged in said frame,
    - a first washing reservoir, said first washing reservoir having a first upper washing reservoir portion and a first lower washing reservoir portion and being positioned within said outer reservoir,
    - a second washing reservoir, said second washing reservoir having a second upper washing reservoir portion and a second lower washing reservoir portion and being positioned within said outer reservoir,
    - a drying reservoir for warm air drying or vacuum drying, said drying reservoir having an upper drying reservoir portion and a lower drying reservoir portion and being positioned within said outer reservoir,
    - a work holding rail arranged above an opening in said first lower washing reservoir portion, said second lower washing reservoir portion and said lower drying reservoir portion,
    - a second conveying means for horizontally moving said work from said first conveying means to said work holding rail, for horizontally moving said work into and out of said first washing reservoir, said second washing reservoir and said drying reservoir by moving said work along said work holding rail, and for horizontally moving said work from said work holding rail to a third conveying means,
    - said third conveying means for horizontally carrying out said work, said third conveying means arranged in said frame, and
    - a raising and lowering means for raising and lowering said first upper washing reservoir portion, said second upper washing reservoir portion and said upper drying reservoir portion;

horizontally carrying in said work with said first conveying means;

horizontally moving said work from said first conveying means to said work holding rail with said second conveying means;

raising said first upper washing reservoir portion and horizontally moving said work to said first washing reservoir along said work holding rail with said second conveying means;

lowering said first upper washing reservoir portion and performing a first washing of said work while said work is in said first washing reservoir;

raising said first upper washing reservoir portion and said second upper washing reservoir portion and horizontally moving said work from said first washing reservoir to said second washing reservoir along said work holding rail with said second conveying means;

lowering said second upper washing reservoir portion and performing a second washing of said work while said work is in said second washing reservoir;

raising said second upper washing reservoir portion and said upper drying reservoir portion and horizontally moving said work from said second washing reservoir to said drying reservoir along said work holding rail with said second conveying means;

lowering said upper drying reservoir portion and drying said work while said work is in said drying reservoir;

raising said upper drying reservoir portion and horizontally moving said work from said drying reservoir to said third conveying means with said second conveying means; and horizontally carrying out said work with said third conveying means, wherein a liquid used in said first washing of said work overflows from a partition plate arranged in said first lower washing reservoir portion, is supplied to a liquid tank for said second washing, and is utilized in said second washing of said work.

* * * * *